US011573276B2

(12) United States Patent
Makino et al.

(10) Patent No.: US 11,573,276 B2
(45) Date of Patent: Feb. 7, 2023

(54) MAGNETIC SENSOR AND ITS MANUFACTURING METHOD

(71) Applicant: TDK CORPORATION, Tokyo (JP)

(72) Inventors: Kenzo Makino, Tokyo (JP); Takafumi Kobayashi, Tokyo (JP)

(73) Assignee: TDK CORPORATION, Tokyo (JP)

( * ) Notice: Subject to any disclaimer, the term of this patent is extended or adjusted under 35 U.S.C. 154(b) by 227 days.

(21) Appl. No.: 17/131,142

(22) Filed: Dec. 22, 2020

(65) Prior Publication Data
US 2021/0302511 A1 Sep. 30, 2021

(30) Foreign Application Priority Data

Mar. 27, 2020 (JP) .............................. JP2020-057483

(51) Int. Cl.
*G01R 33/09* (2006.01)
*H01L 43/10* (2006.01)
*H01L 43/12* (2006.01)

(52) U.S. Cl.
CPC .............. *G01R 33/09* (2013.01); *H01L 43/10* (2013.01); *H01L 43/12* (2013.01)

(58) Field of Classification Search
CPC .. G01R 33/09; G01R 33/091; G01R 33/0052; G01R 33/0047; G01R 33/093; H01L 43/10; H01L 43/12; H01L 43/02; H01L 43/08; G01D 5/145
See application file for complete search history.

(56) References Cited

U.S. PATENT DOCUMENTS

| 8,207,587 | B2 * | 6/2012 | Aiso | G01R 33/093 |
| | | | | 257/427 |
| 2005/0270020 | A1 * | 12/2005 | Peczalski | G01R 33/0206 |
| | | | | 324/252 |
| 2006/0171081 | A1 * | 8/2006 | Breuer | G11B 5/3951 |
| 2008/0169807 | A1 | 7/2008 | Naito et al. | |

FOREIGN PATENT DOCUMENTS

EP 3 199 965 A1 8/2017
JP 2001-102659 A 4/2001

* cited by examiner

*Primary Examiner* — Lee E Rodak
(74) *Attorney, Agent, or Firm* — Oliff PLC

(57) ABSTRACT

A magnetic sensor includes an MR element and a support member. A top surface of the support member includes an inclined portion. The MR element includes an MR element main body, a lower electrode, and an upper electrode. The lower electrode includes a first end closest to a lower end of the inclined portion and a second end closest to an upper end of the inclined portion. The MR element main body is located at a position closer to the second end than to the first end.

7 Claims, 7 Drawing Sheets

MAGNETIC SENSOR AND ITS MANUFACTURING METHOD

BACKGROUND OF THE INVENTION

1. Field of the Invention

The present invention relates to a magnetic sensor including a magnetoresistive element and its manufacturing method.

2. Description of the Related Art

Magnetic sensors have been used for a variety of applications. Examples of known magnetic sensors include one that uses a spin-valve magnetoresistive element provided on a substrate. The spin-valve magnetoresistive element includes a magnetization pinned layer having a magnetization whose direction is fixed, a free layer having a magnetization whose direction is variable depending on the direction of an applied magnetic field, and a gap layer located between the magnetization pinned layer and the free layer. In many cases, the spin-valve magnetoresistive element provided on a substrate is configured to have sensitivity to a magnetic field in a direction parallel to the surface of the substrate. Such a magnetoresistive element is thus suitable to detect a magnetic field that changes in direction within a plane parallel to the substrate surface.

On the other hand, a system including a magnetic sensor may be intended to detect a magnetic field containing a component in a direction perpendicular to the surface of a substrate by using a magnetoresistive element provided on the substrate. In such a case, the magnetic field containing the component in the direction perpendicular to the surface of the substrate can be detected by providing a soft magnetic body for converting a magnetic field in the direction perpendicular to the surface of the substrate into a magnetic field in the direction parallel to the surface of the substrate or locating the magnetoresistive element on an inclined surface formed on the substrate.

JP 2001-102659 A describes a magnetoresistive element that is formed on a substrate and includes a plurality of magnetic tunnel junction structures connected in series. In this magnetoresistive element, lower and upper electrodes connect a pair of adjoining magnetic tunnel junction structures. JP 2001-102659 A also describes formation of a layered structure including lower electrodes on the substrate by etching off outer peripheral ends of the lower electrodes by ion beam etching (ion milling) using an ion milling apparatus.

EP 3199965 A1 describes a magnetic sensor including a magnetic detection unit that includes a plurality of magnetoresistive elements formed on a substrate and has a magnetic sensing axis in a direction parallel to the plane of the substrate. In this magnetic sensor, lower and upper electrodes connect two adjoining magnetoresistive elements. This magnetic sensor further includes a magnetic converging unit including a plurality of magnetic converging members made of a soft magnetic material. This magnetic sensor detects magnetic fields in X-, Y-, and Z-axis directions by converting the direction of an external magnetic field into the direction of the magnetic sensing axis with the plurality of magnetic converging members.

US 2008/0169807 A1 describes a magnetic sensor including X-, Y-, and Z-axis sensors located on a thick substrate film. In this magnetic sensor, a plurality of magnetic sensing portions of a giant magnetoresistive element constituting the Z-axis sensor are located on midsections of inclined surfaces of a V-shaped groove formed in the thick substrate film. This magnetic sensor also includes a bias magnet portion that connects two magnetic sensing portions formed on two adjoining inclined surfaces. US 2008/0169807 A1 also describes formation of the bias magnet portion by depositing a magnet film for making the bias magnet portion over the entire substrate surface and then removing unneeded portions by etching.

Like the Z-axis sensor described in US 2008/0169807 A1, a magnetic sensor including a magnetoresistive element located on an inclined surface can increase the occupation area of the magnetoresistive element per unit area, compared to the magnetic sensor described in EP 3199965 A1. Suppose that a magnetic sensor includes a plurality of magnetoresistive elements located on an inclined surface. In this magnetic sensor, the plurality of magnetoresistive elements located on the one inclined surface are connected by lower and upper electrodes. The occupation area of the magnetoresistive elements per unit area can be increased by reducing a dimension (hereinafter, referred to as a width) of the inclined surface in a direction (hereinafter, referred to as a width direction) orthogonal to the direction of arrangement of the plurality of magnetoresistive elements.

However, the smaller the width of the inclined surface, the smaller the width of the lower electrodes. On the other hand, in view of increasing the occupation area of the magnetoresistive elements per unit area, the width of the magnetoresistive elements is not much reduced with the reduction in the width of the inclined surface. In other words, the smaller the width of the inclined surface, the smaller the width of the lower electrodes becomes relative to the width of the magnetoresistive elements. As a result, the distances from both ends of the lower electrodes in the width direction to the magnetoresistive elements decrease.

As described in JP 2001-102659 A and US 2008/0169807 A1, the lower electrodes are formed by etching a metal film by ion milling, for example. If the metal film is etched by ion milling, etched and scattered substances of the metal film can adhere to the metal film and the like to form re-deposition films on the surface of the lower electrodes etc. The re-deposition films are formed in regions within a predetermined range from both ends of the lower electrodes. If the distances from both ends of the lower electrodes to the magnetoresistive elements decrease as described above, there occur problems such as formation of the magnetoresistive elements on the re-deposition films and a short circuit caused by contact of the re-deposition films with the upper electrodes.

SUMMARY OF THE INVENTION

An object of the present invention is to provide a magnetic sensor that includes a magnetoresistive element located on an inclined portion and is configured so that the occurrence of the problems due to a reduction in the width of the inclined portion can be prevented, and its manufacturing method.

A magnetic sensor according to the present invention includes a magnetoresistive element whose resistance changes with an external magnetic field, and a support member that supports the magnetoresistive element. The support member includes a top surface opposed to the magnetoresistive element and a bottom surface located on a side opposite to the top surface. The top surface of the support member includes an inclined portion inclined relative to the bottom surface.

The magnetoresistive element includes a main body, and a lower electrode and an upper electrode that supply a current to the main body. The main body is located on the inclined portion. The lower electrode is interposed between the main body and the inclined portion. The upper electrode is located on the main body.

The inclined portion includes a lower end closest to the bottom surface and an upper end farthest from the bottom surface. The lower electrode includes a first end closest to the lower end of the inclined portion and a second end closest to the upper end of the inclined portion. The main body is located at a position closer to the second end of the lower electrode than to the first end of the lower electrode.

In the magnetic sensor according to the present invention, a distance from the upper end of the inclined portion to the first end of the lower electrode may be smaller than or greater than a distance from the upper end of the inclined portion to the lower end of the inclined portion.

In the magnetic sensor according to the present invention, the upper electrode may include a third end closest to the lower end of the inclined portion. A distance from the main body to the third end of the upper electrode may be smaller than a distance from the main body to the first end of the lower electrode.

A manufacturing method for a magnetic sensor according to the present invention includes a step of forming the magnetoresistive element and a step of forming the support member. The step of forming the magnetoresistive element includes a step of forming the main body, a step of forming the lower electrode, and a step of forming the upper electrode.

The step of forming the lower electrode includes a step of forming a metal film on the support member, a step of forming an etching mask, and an etching step of etching the metal film by using the etching mask so that the metal film makes the lower electrode. The etching mask has an undercut that forms a space between the etching mask and an underlayer of the etching mask.

In the manufacturing method for a magnetic sensor according to the present invention, the undercut may form a first space closest to the lower end of the inclined portion and a second space closest to the upper end of the inclined portion. A maximum dimension of the first space in a first direction perpendicular to the bottom surface of the support member may be greater than a maximum dimension of the second space in the first direction. A dimension of the first space in a second direction parallel to a direction from the lower end to the upper end of the inclined portion may be greater than a dimension of the second space in the second direction.

In the manufacturing method for a magnetic sensor according to the present invention, the step of forming the etching mask may include forming the etching mask on the metal film. In such a case, the step of forming the main body may be performed after the etching step.

In the magnetic sensor and its manufacturing method according to the present invention, the magnetoresistive element includes the main body, the lower electrode, and the upper electrode. The lower electrode includes the first end closest to the lower end of the inclined portion and the second end closest to the upper end of the inclined portion. The main body is located at a position closer to the second end of the lower electrode than to the first end of the lower electrode. According to the present invention, the magnetic sensor including the magnetoresistive element located on the inclined portion can thus prevent the occurrence of the problems due to a reduction in the width of the inclined portion.

Other and further objects, features and advantages of the present invention will appear more fully from the following description.

DETAILED DESCRIPTION OF THE PREFERRED EMBODIMENTS

A preferred embodiment of the present invention will now be described in detail with reference to the drawings. An outline of a magnetic sensor system including a magnetic sensor according to the embodiment of the present invention will initially be described with reference to FIG. 1. A magnetic sensor system 100 according to the present embodiment includes a magnetic sensor 1 according to the present embodiment and a magnetic field generator 5. The magnetic field generator 5 generates a target magnetic field MF that is a magnetic field for the magnetic sensor 1 to detect (magnetic field to be detected).

The magnetic field generator 5 is rotatable about the rotation axis C. The magnetic field generator 5 includes a pair of magnets 6A and 6B. The magnets 6A and 6B are arranged at symmetrical positions with a virtual plane including the rotation axis C at the center. The magnets 6A and 6B each have an N pole and an S pole. The magnets 6A and 6B are located in an orientation such that the N pole of the magnet 6A is opposed to the S pole of the magnet 6B. The magnetic field generator 5 generates the target magnetic field MF in the direction from the N pole of the magnet 6A to the S pole of the magnet 6B.

The magnetic sensor 1 is located at a position where the target magnetic field MF at a predetermined reference position can be detected. The reference position may be located on a rotation axis C. In the following description, the reference position is located on the rotation axis C. The magnetic sensor 1 detects the target magnetic field MF generated by the magnetic field generator 5, and generates a detection value Vs. The detection value Vs has a correspondence with a relative position, or rotational position in particular, of the magnetic field generator 5 with respect to the magnetic sensor 1.

Figure 1:
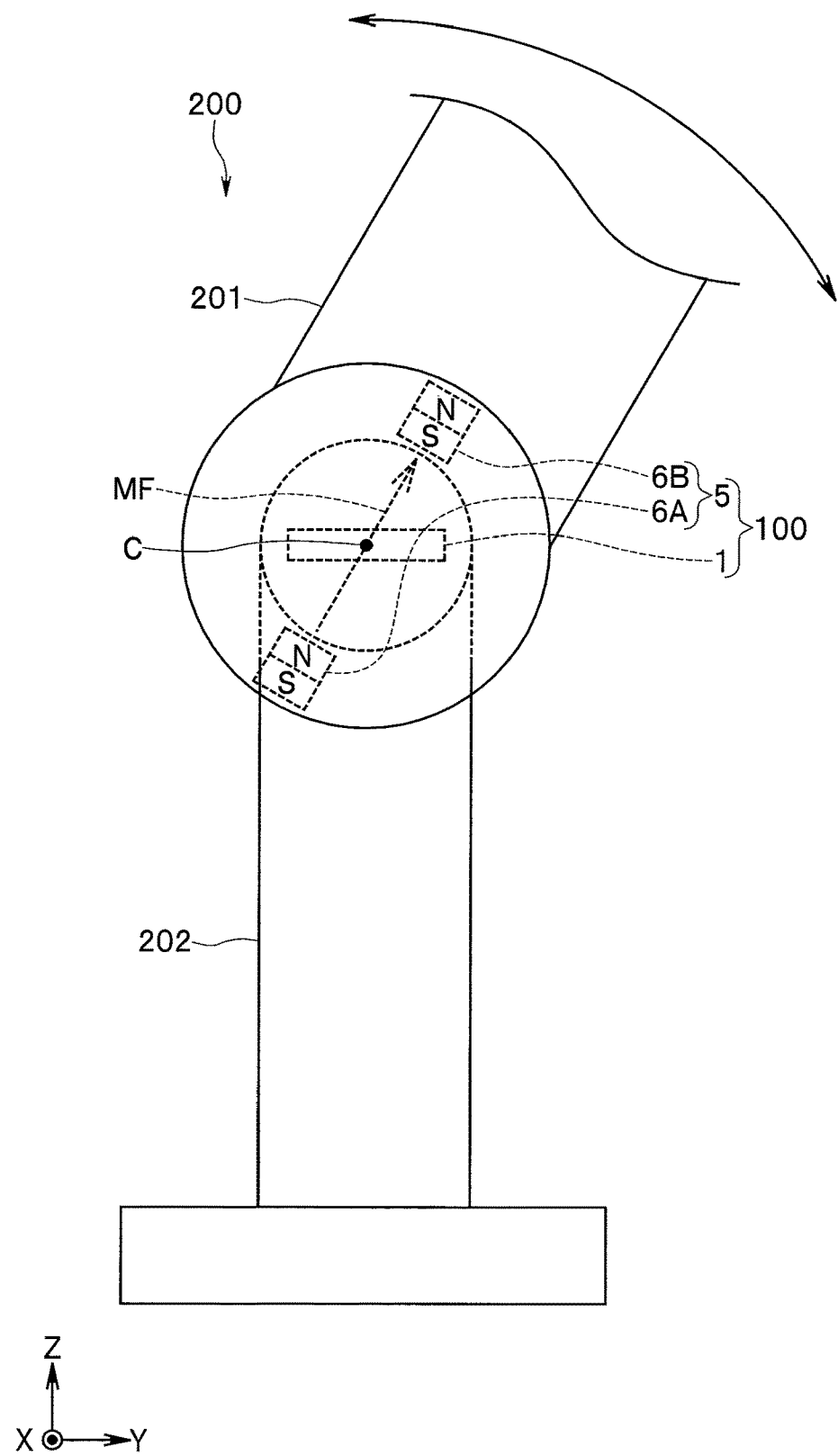
FIG. 1 is a perspective view showing a schematic configuration of a magnetic sensor system of an embodiment of the invention.

The magnetic sensor system 100 can be used as a device for detecting the rotational position of a rotatable moving part in an apparatus that includes the moving part. Examples of such an apparatus include a joint of an industrial robot. FIG. 1 shows an example where the magnetic sensor system 100 is applied to an industrial robot 200.

The industrial robot 200 shown in FIG. 1 includes a moving part 201 and a support unit 202 that rotatably supports the moving part 201. The moving part 201 and the support unit 202 are connected at a joint. The moving part 201 rotates about a rotation axis C. For example, if the magnetic sensor system 100 is applied to the joint of the industrial robot 200, the magnetic sensor 1 may be fixed to the support unit 202, and the magnets 6A and 6B may be fixed to the moving part 201.

Now, we define X, Y, and Z directions as shown in FIG. 1. The X, Y, and Z directions are orthogonal to one another. In the present embodiment, a direction parallel to the rotation axis C (in FIG. 1, a direction out of the plane of the drawing) will be referred to as the X direction. In FIG. 1, the Y direction is shown as a rightward direction, and the Z direction is shown as an upward direction. The opposite directions to the X, Y, and Z directions will be referred to as −X, −Y, and −Z directions, respectively. The direction of the target magnetic field MF rotates within the YZ plane, about the reference position on the rotation axis C.

Figure 2:
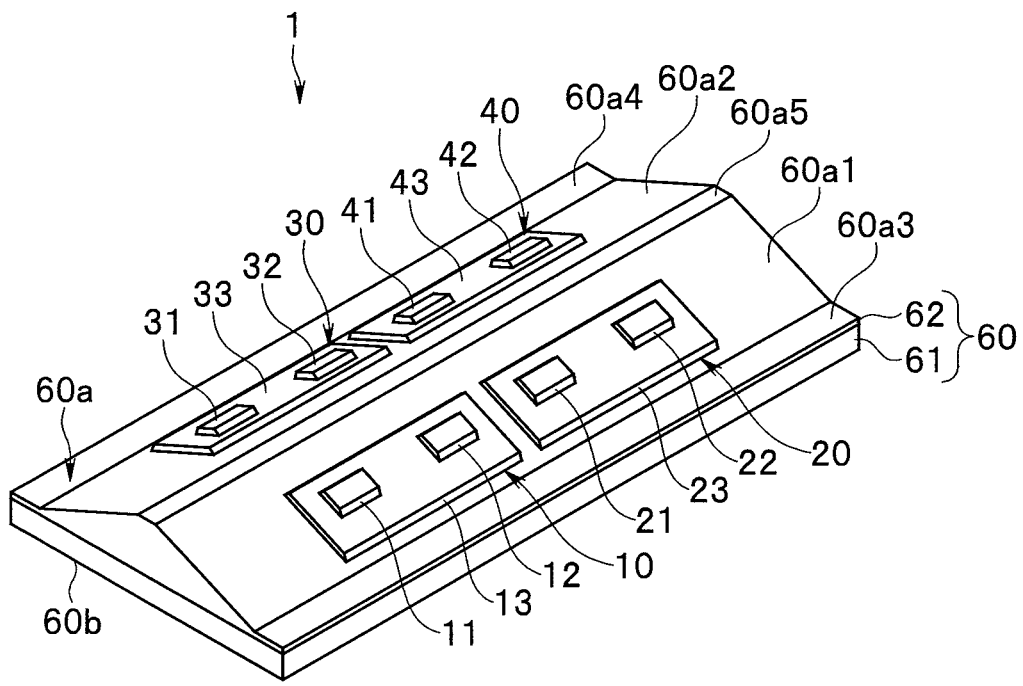
FIG. 2 is a perspective view showing a magnetic sensor according to the embodiment of the invention.
Figure 2:
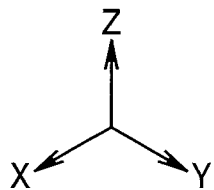
Figure 3:
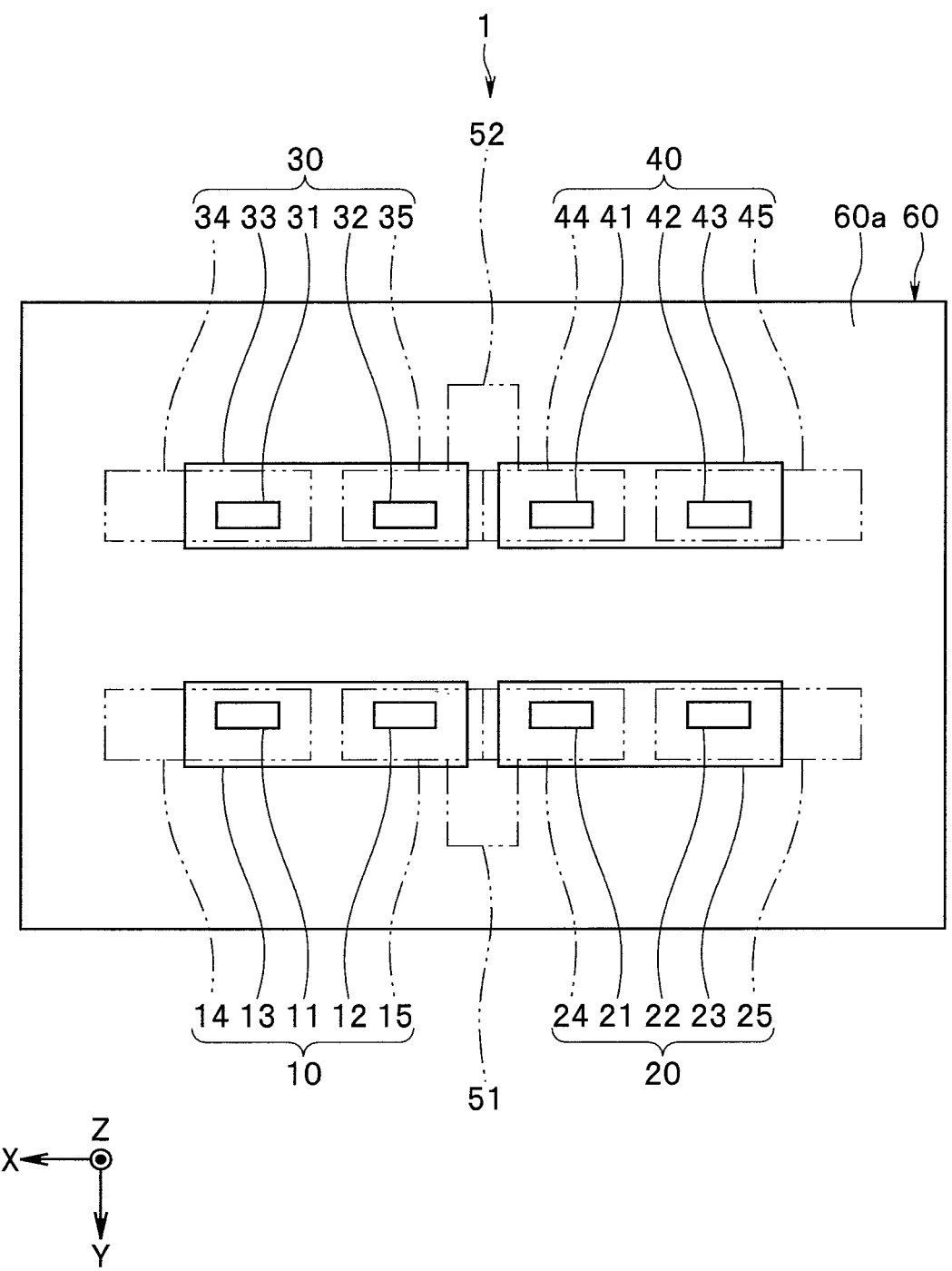
FIG. 3 is a plan view showing a magnetic sensor according to the embodiment of the invention.
Figure 4:
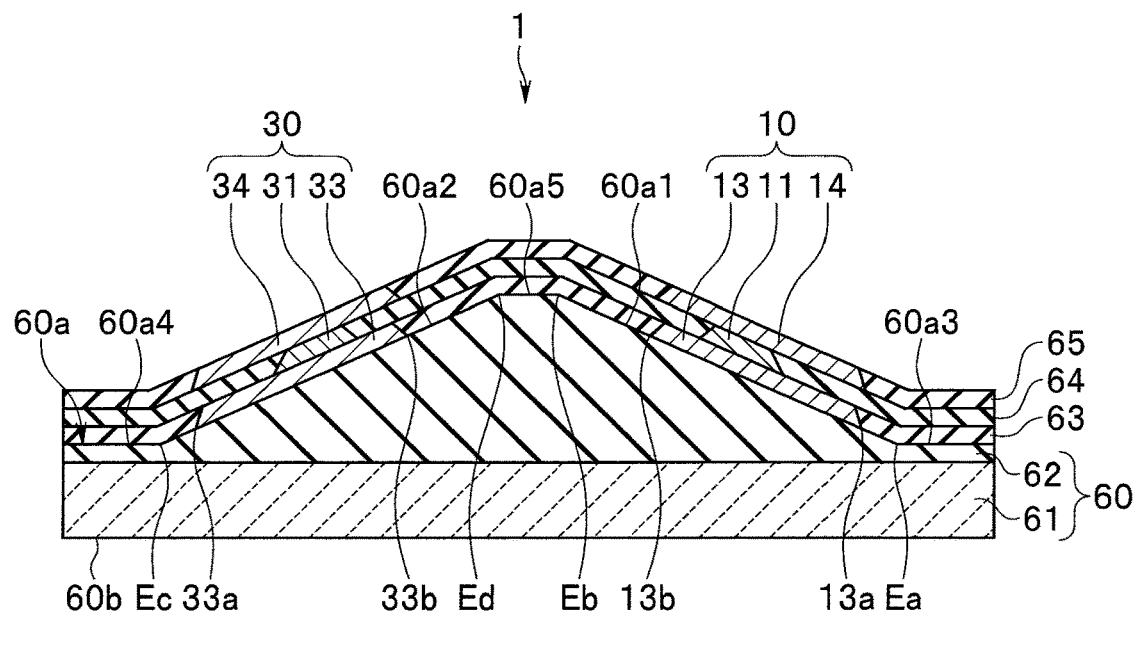
FIG. 4 is a sectional view showing a cross section of the magnetic sensor according to the embodiment of the invention.
Figure 5:
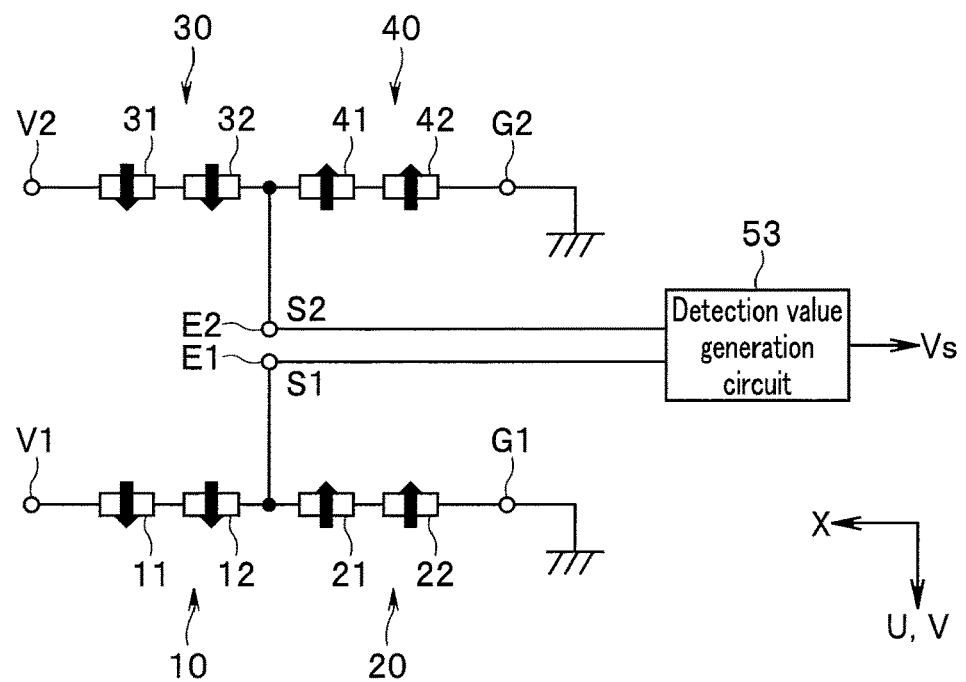
FIG. 5 is a circuit diagram showing the circuit configuration of the magnetic sensor according to the embodiment of the invention.

Next, a configuration of the magnetic sensor 1 according to the present embodiment will be described with reference to FIGS. 2 to 5. FIG. 2 is a perspective view showing a magnetic sensor 1. FIG. 3 is a plan view showing a magnetic sensor 1. FIG. 4 is a sectional view showing a cross section of the magnetic sensor 1. FIG. 5 is a circuit diagram showing the circuit configuration of the magnetic sensor 1.

The magnetic sensor 1 includes at least one magnetoresistive element whose resistance changes with an external magnetic field, and a support member 60 that supports the at least one magnetoresistive element. A magnetoresistive element will hereinafter be referred to as an MR element. The at least one MR element is each configured to be able to detect the target magnetic field MF. In the present embodiment, the magnetic sensor 1 includes four MR elements 10, 20, 30, and 40 as the at least one MR element.

As shown in FIGS. 2 and 4, the support member 60 includes a top surface 60a opposed to the MR elements 10, 20, 30, and 40, and a bottom surface 60b located on a side opposite to the top surface 60a. The top surface 60a is located at an end of the support member 60 in the Z direction. The bottom surface 60b is located at an end of the support member 60 in the −Z direction. The bottom surface 60b is parallel to the XY plane.

The top surface 60a of the support member 60 includes at least one inclined portion inclined relative to the bottom surface 60b. In the present embodiment, the top surface 60a of the support member 60 includes two inclined portions 60a1 and 60a2 symmetrical about a ZX plane. The entirety of each of the inclined portions 60a1 and 60a2 is perpendicular to the YZ plane and inclined relative to the XY plane.

As shown in FIG. 4, the inclined portion 60a1 includes a lower end Ea closest to the bottom surface 60b and an upper end Eb farthest from the bottom surface 60b. The lower end Ea of the inclined portion 60a1 is located at an end of the inclined portion 60a1 in the Y direction. The upper end Eb of the inclined portion 60a1 is located at an end of the inclined portion 60a1 in the −Y direction.

As shown in FIG. 4, the inclined portion 60a2 includes a lower end Ec closest to the bottom surface 60b and an upper end Ed farthest from the bottom surface 60b. The lower end Ec of the inclined portion 60a2 is located at an end of the inclined portion 60a2 in the −Y direction. The upper end Ed of the inclined portion 60a2 is located at an end of the inclined portion 60a2 in the Y direction.

The top surface 60a of the support member 60 further includes three flat portions 60a3, 60a4, and 60a5. The flat portion 60a3 is connected to the lower end Ea of the inclined portion 60a1. The flat portion 60a4 is connected to the lower end Ec of the inclined portion 60a2. The flat portion 60a5 is connected to the upper end Eb of the inclined portion 60a1 and the upper end Ed of the inclined portion 60a2. All the flat portions 60a3 to 60a5 are parallel to the XY plane.

In view of the manufacturing precision and the like of the magnetic sensor 1, the inclined portions 60a1 and 60a2 may be curved. In such a case, the upper end Eb of the inclined portion 60a1 and the upper end Ed of the inclined portion 60a2 may be connected to each other.

The MR elements 10 and 20 are located on the inclined portion 60a1. The MR elements 30 and 40 are located on the inclined portion 60a2. As shown in FIGS. 2 and 3, the MR elements 10 and 20 are arranged in a row in this order along the −X direction. The MR elements 30 and 40 are arranged in a row in this order along the −X direction, at positions in front of the MR elements 10 and 20 in the −Y direction. The set of MR elements 10 and 20 and the set of MR elements 30 and 40 may be located symmetrically about the XZ plane.

Each of the MR elements 10, 20, 30, and 40 includes at least one MR element main body, and at least one lower electrode and at least one upper electrode that supply a current to the at least one MR element main body. In the present embodiment, each of the MR elements 10, 20, 30, and 40 includes two MR element main bodies, one lower electrode, and two upper electrodes as the at least one MR element main body, the at least one lower electrode, and the at least one upper electrode.

The MR elements 10 and 20 have the same configuration. The following description serves as both a description of the MR element 10 (with reference numerals before parentheses) and a description of the MR element 20 (with parenthesized reference numerals). The MR element 10 (20) includes MR element main bodies 11 and 12 (21 and 22), a lower electrode 13 (23), and upper electrodes 14 and 15 (24 and 25), and is located on the inclined portion 60a1. The lower electrode 13 (23) is interposed between the MR element main bodies 11 and 12 (21 and 22) and the inclined portion 60a1. The upper electrode 14 (24) is located on the MR element main body 11 (21). The upper electrode 15 (25) is located on the MR element main body 12 (22). Each of the MR element main bodies 11 and 12 (21 and 22) has a bottom surface facing the lower electrode 13 (23) and a top surface on the opposite side.

The MR elements 30 and 40 have the same configuration. The following description serves as both a description of the MR element 30 (with reference numerals before parentheses) and a description of the MR element 40 (with parenthesized reference numerals). The MR element 30 (40) includes MR element main bodies 31 and 32 (41 and 42), a lower electrode 33 (43), and upper electrodes 34 and 35 (44 and 45), and is located on the inclined portion 60a2. The lower electrode 33 (43) is interposed between the MR element main bodies 31 and 32 (41 and 42) and the inclined portion 60a2. The upper electrode 34 (44) is located on the MR element main body 31 (41). The upper electrode 35 (45) is located on the MR element main body 32 (42). Each of the MR element main bodies 31 and 32 (41 and 42) has a bottom surface facing the lower electrode 33 (43) and a top surface on the opposite side.

As shown in FIGS. 2 and 3, the MR element main bodies 11, 12, 21 and 22 are arranged in a row in this order along the −X direction. The MR element main bodies 31, 32, 41 and 42 are arranged in a row in this order along the −X direction, at positions in front of the MR element main bodies 11, 12, 21 and 22 in the −Y direction. The set of MR element main bodies 11, 12, 21 and 22 and the set of MR element main bodies 31, 32, 41 and 42 may be located symmetrically about the XZ plane.

The magnetic sensor 1 further includes a lead electrode 51 connected to the border of the upper electrodes 15 and 24, and a lead electrode 52 connected to the border of the upper electrodes 35 and 44. The lower electrodes 13, 23, 33, and 43, the upper electrodes 14, 15, 24, 25, 34, 35, 44, and 45, and the lead electrodes 51 and 52 are made of a conductive material such as Cu, for example. In FIG. 2, the upper electrodes 14, 15, 24, 25, 34, 35, 44, and 45 and the lead electrodes 51 and 52 are omitted.

As shown in FIGS. 2 and 4, the support member 60 includes a substrate 61 and an insulating layer 62 located on the substrate 61. The substrate 61 is a semiconductor substrate made of a semiconductor such as Si, for example. The substrate 61 has a top surface located at an end of the substrate 61 in the Z direction, and a bottom surface located at an end of the substrate 61 in the −Z direction. The bottom surface 60b of the support member 60 is constituted by the bottom surface of the substrate 61. The substrate 61 has a constant thickness (dimension in the Z direction).

The insulating layer 62 is made of an insulating material such as SiO₂, for example. The insulating layer 62 includes a top surface located at an end in the Z direction. The top surface 60a of the support member 60 is constituted by the top surface of the insulating layer 62. The insulating layer 62 has a minimum thickness (dimension in the Z direction) near the ends of the insulating layer 62 in the Y and −Y directions, and a maximum thickness near the center of the insulating layer 62 in a direction parallel to the Y direction.

The lower electrodes 13, 23, 33, and 43 are located on the top surface 60a of the support member 60, i.e., on the top surface of the insulating layer 62. As shown in FIG. 4, the magnetic sensor 1 further includes insulating layers 63, 64 and 65. The insulating layer 63 is located on the top surface of the insulating layer 62, around the lower electrodes 13, 23, 33, and 43. As shown in FIG. 2, the MR element main bodies 11, 12, 21, 22, 31, 32, 41, and 42 are located on the lower electrodes 13, 23, 33, and 43.

The insulating layer 64 is located on the lower electrodes 13, 23, 33, and 43 and the insulating layer 63, around the MR element main bodies 11, 12, 21, 22, 31, 32, 41, and 42. The upper electrodes 14, 15, 24, 25, 34, 35, 44, and 45 are located on the MR element main bodies 11, 12, 21, 22, 31, 32, 41, and 42, respectively (see FIG. 3), and on the insulating layer 64 (see FIG. 4).

The lead electrodes 51 and 52 are located on the insulating layer 64. The insulating layer 65 is located on the insulating layer 64, around the upper electrodes 14, 15, 24, 25, 34, 35, 44, and 45 and the lead electrodes 51 and 52. In FIGS. 2 and 3, the insulating layers 63 to 65 are omitted.

The magnetic sensor 1 may further include a non-shown insulating layer covering the foregoing upper electrodes, the lead electrodes 51 and 52, and the insulating layer 65. The insulating layers 63 to 65 and the non-shown insulating layer are made of an insulating material such as SiO₂, for example.

As shown in FIG. 5, the magnetic sensor 1 further includes power supply nodes V1 and V2, ground nodes G1 and G2, and signal output nodes E11 and E12. Predetermined magnitude of power supply voltages are applied to the power supply nodes V1 and V2. The ground nodes G1 and G2 are grounded.

The MR element 10 is arranged between the power supply node V1 and the signal output node E1. The MR element main bodies 11 and 12 are connected in series in this order from the power supply node V1 side. The upper electrode 14 is electrically connected to the power supply node V1. The upper electrode 15 is electrically connected to the signal output node E1 via the lead electrode 51.

The MR element 20 is arranged between the signal output node E1 and the ground node G1. The MR element main bodies 21 and 22 are connected in series in this order from the signal output node E1 side. The upper electrode 24 is electrically connected to the signal output node E1 via the lead electrode 51. The upper electrode 25 is electrically connected to the ground node G1.

The MR element 30 is arranged between the power supply node V2 and the signal output node E2. The MR element main bodies 31 and 32 are connected in series in this order from the power supply node V2 side. The upper electrode 34 is electrically connected to the power supply node V2. The upper electrode 35 is electrically connected to the signal output node E2 via the lead electrode 52.

The MR element 40 is arranged between the signal output node E2 and the ground node G2. The MR element main bodies 41 and 42 are connected in series in this order from the signal output node E2 side. The upper electrode 44 is electrically connected to the signal output node E2 via the lead electrode 52. The upper electrode 45 is electrically connected to the ground node G2.

In terms of circuit configuration, the MR element main bodies 12 and 21 are connected in series. The signal output node E1 outputs a signal corresponding to the potential of the connection point between the MR element main bodies 12 and 21 as a detection signal S1.

In terms of circuit configuration, the MR element main bodies 32 and 41 are connected in series. The signal output node E2 outputs a signal corresponding to the potential of the connection point between the MR element main bodies 32 and 41 as a detection signal S2.

The magnetic sensor 1 further includes a detection value generation circuit 53 that generates the detection value Vs on the basis of the detection signals S1 and S2. The detection value Vs depends on the detection signals S1 and S2. The detection value generation circuit 53 includes an application specific integrated circuit (ASIC) or a microcomputer, for example.

The substrate 61 and the portions of the magnetic sensor 1 stacked on the substrate 61 are referred to collectively as a detection unit. FIGS. 1 to 4 can be said to show the detection unit. The detection value generation circuit 53 may be integrated with or separate from the detection unit.

The configuration of the MR elements 10, 20, 30 and 40 will now be described in detail. In the present embodiment, in particular, each of the MR elements 10, 20, 30 and 40 is a spin-valve MR element. Each of the MR element main bodies 11, 12, 21, 22, 31, 32, 41, and 42 includes a magnetization pinned layer having a magnetization whose direction is fixed, a free layer having a magnetization whose direction is variable depending on the direction of an external magnetic field, and a gap layer located between the magnetization pinned layer and the free layer. Each of the MR elements 10, 20, 30 and 40 may be a tunneling magnetoresistive element (TMR) element or a giant magnetoresistive element (GMR) element. In the TMR element, the gap layer is a tunnel barrier layer. In the GMR element, the gap layer is a nonmagnetic conductive layer. The resistances of the MR elements 10, 20, 30 and 40 change with an angle that the direction of the magnetization of the free layer forms with respect to the direction of the magnetization of the magnetization pinned layer. The resistance is minimized if the angle is 0°. The resistance is maximized if the angle is 180°. In each of the MR elements 10, 20, 30, and 40, the free layer has a shape anisotropy that sets the direction of the magnetization easy axis to be orthogonal to the magnetization direction of the magnetization pinned layer. In FIG. 5, the filled arrows indicate the directions of the magnetizations of the magnetization pinned layers included in the respective MR element main bodies 11, 12, 21, 22, 31, 32, 41, and 42.

Next, an electrical connection relationship between the MR element main bodies, the lower electrodes, and the upper electrodes in the MR elements 10, 20, 30, and 40 will be described. The following description serves as both a description of the electrical connection relationship in the MR elements 10 and 20 (with reference numerals before parentheses) and a description of the electrical connection relationship in the MR elements 30 and 40 (with parenthesized reference numerals). The lower electrode 13 (33) electrically connects the bottom surfaces of the respective MR element main bodies 11 and 12 (31 and 32). The upper electrodes 15 and 24 (35 and 44) electrically connect the top surfaces of the respective MR element main bodies 12 and 21 (32 and 42). The lower electrode 23 (43) electrically connects the bottom surfaces of the respective MR element main bodies 21 and 22 (41 and 42).

Next, a positional relationship between the MR element main bodies, the lower electrode, and the upper electrodes in each of the MR elements 10, 20, 30, and 40 will be described. The positional relationship between the MR element main bodies 11 and 12 and the lower electrode 13 in the MR element 10 will initially be described with reference to FIG. 4. The lower electrode 13 includes a first end 13a closest to the lower end Ea of the inclined portion 60a1 and a second end 13b closest to the upper end Eb of the inclined portion 60a1.

The entire lower electrode 13 is located on the inclined portion 60a1. The distance from the upper end Eb of the inclined portion 60a1 to the first end 13a of the lower electrode 13 is smaller than that from the upper end Eb to the lower end Ea of the inclined portion 60a1.

The MR element main body 11 is located at a position closer to the second end 13b than to the first end 13a. The distance from the second end 13b to the MR element main body 11 is smaller than that from the first end 13a to the MR element main body 11. The same applies to the MR element main body 12.

The description of the positional relationship between the MR element main bodies 11 and 12 and the lower electrode 13 in the MR element 10 also applies to the positional relationship between the MR element main bodies 21 and 22 and the lower electrode 23 in the MR element 20 if the reference numerals 11, 12, and 13 are replaced with the reference numerals 21, 22, and 23, respectively.

Next, the positional relationship between the MR element main bodies 31 and 32 and the lower electrode 33 in the MR element 30 will be described with reference to FIG. 4. The lower electrode 33 has a first end 33a closest to the lower end Ec of the inclined portion 60a2 and a second end 33b closest to the upper end Ed of the inclined portion 60a2. The description of the positional relationship between the MR element main bodies 11 and 12 and the lower electrode 13 in the MR element 10 also applies to the positional relationship between the MR element main bodies 31 and 32 and the lower electrode 33 in the MR element 30 if the reference numerals 11, 12, 13, 13a, 13b, 60a1, Ea and Eb are replaced with the reference numerals 31, 32, 33, 33a, 33b, 60a2, Ec and Ed, respectively. The description of the positional relationship between the MR element main bodies 31 and 32 and the lower electrode 33 in the MR element 30 also applies to the positional relationship between the MR element main bodies 41 and 42 and the lower electrode 43 in the MR element 40 if the reference numerals 31, 32, and 33 are replaced with the reference numerals 41, 42, and 43, respectively.

Now, a manufacturing method for the magnetic sensor 1 according to the present embodiment will be described with reference to FIG. 6 to FIG. 10. The manufacturing method for the magnetic sensor 1 includes steps of forming the portions of the magnetic sensor 1 shown in FIGS. 1 to 4, i.e., the detection unit, and steps of completing the magnetic sensor 1 by using the detection unit. FIGS. 6 to 10 show the steps of forming the detection unit.

Figure 6:
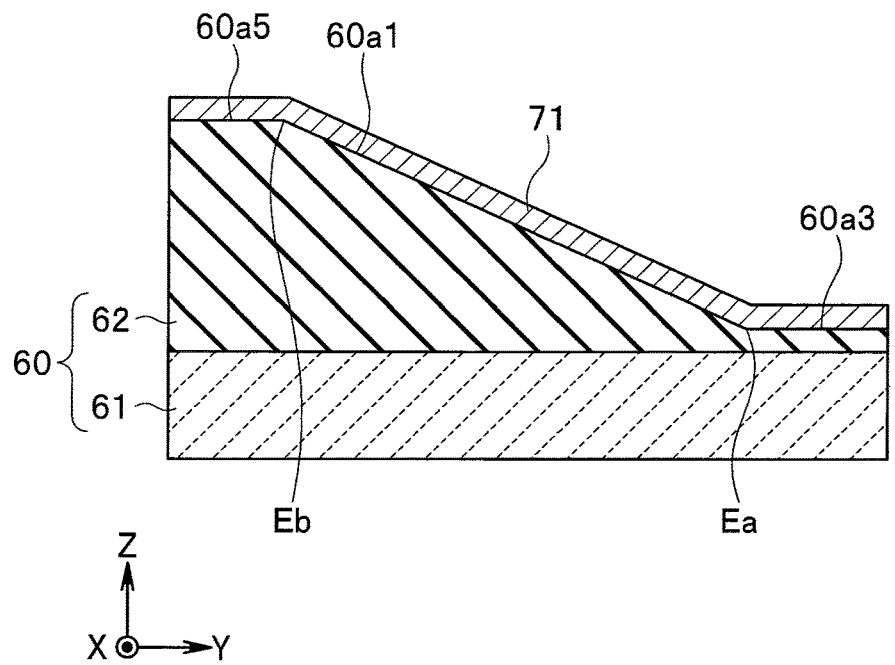
FIG. 6 is a cross-sectional view illustrating a step of a manufacturing method for the magnetic sensor according to the embodiment of the invention.

As shown in FIG. 6, in the steps of forming the detection unit, the insulating layer 62 is initially formed on the substrate 61. The insulating layer 62 may be formed by forming a photoresist mask on the substrate 61 and then forming an insulating film. The insulating layer 62 may be formed by forming an insulating film on the substrate 61 and then etching a part of the insulating film. The formation of the insulating layer 62 completes the support member 60. Next, a metal film 71 for eventually making the lower electrodes 13, 23, 33, and 43 is formed on the insulating layer 62, i.e., on the support member 60. The metal film 71 is formed to cover the entire top surface of the insulating layer 62.

Figure 7:
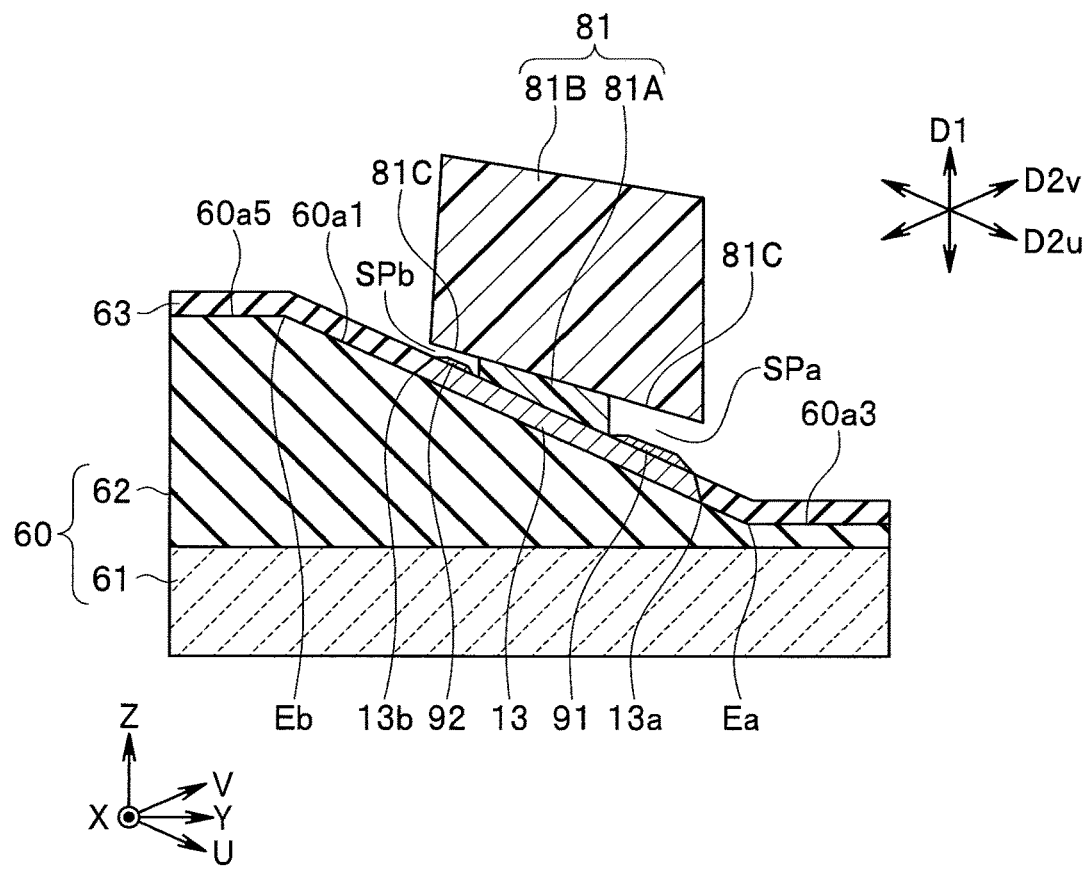
FIG. 7 is a cross-sectional view illustrating a step that follows the step in FIG. 6.

FIG. 7 shows the next step. In this step, first to fourth etching masks 81 are initially formed on the metal film 71. The first, second, third, and fourth etching masks 81 are used to form the lower electrodes 13, 23, 33, and 43, respectively. FIG. 7 shows the first etching mask 81.

Each of the first to fourth etching masks 81 has an undercut 81C. The undercut 81C forms a space between the etching mask 81 and an underlayer of the etching mask 81. In the present embodiment, each of the first to fourth etching masks 81 includes a lower layer 81A located on the metal film 71 and an upper layer 81B located on the lower layer 81A. The upper layer 81B is made of a photoresist patterned by photolithography. The lower layer 81A is made of a material that dissolves in a developing agent used in patterning the upper layer 81B, for example. The undercut 81C is formed by removing a part of the lower layer 81A in patterning the upper layer 81B.

In the step shown in FIG. 7, an etching step of etching the metal film 71 is then performed by ion milling, for example, using the first to fourth etching masks 81 so that the metal film 71 makes the lower electrodes 13, 23, 33, and 43. As described above, each of the first to fourth etching masks 81 has the undercut 81C. In the etching step, etched and scattered substances of the metal film 71 enter the space formed by the undercut 81C to form a re-deposition film on the surface of each of the lower electrodes 13, 23, 33, and 43. In FIG. 7, the reference numeral 91 represents the re-deposition film formed on the surface of the lower electrode 13, near the first end 13a of the lower electrode 13. The reference numeral 92 represents the re-deposition film formed on the surface of the lower electrode 13, near the second end 13b of the lower electrode 13.

Although not shown in the drawings, re-deposition films similar to the re-deposition films 91 and 92 are also formed on the surface of each of the lower electrodes 23, 33, and 43. A re-deposition film formed on the surface of a lower electrode near the first end of the lower electrode will hereinafter be referred to as a first re-deposition film. A re-deposition film formed near the second end of the lower electrode will be referred to as a second re-deposition film.

In the step shown in FIG. 7, the insulating layer 63 is then formed with the first to fourth etching masks 81 left unremoved. The insulating layer 63 is also formed on the surfaces of the first to fourth etching masks 81. In FIG. 7, the portion of the insulating layer 63 formed on the surface of the first etching mask 81 is omitted. The first to fourth etching masks 81 are then removed.

Figure 8:
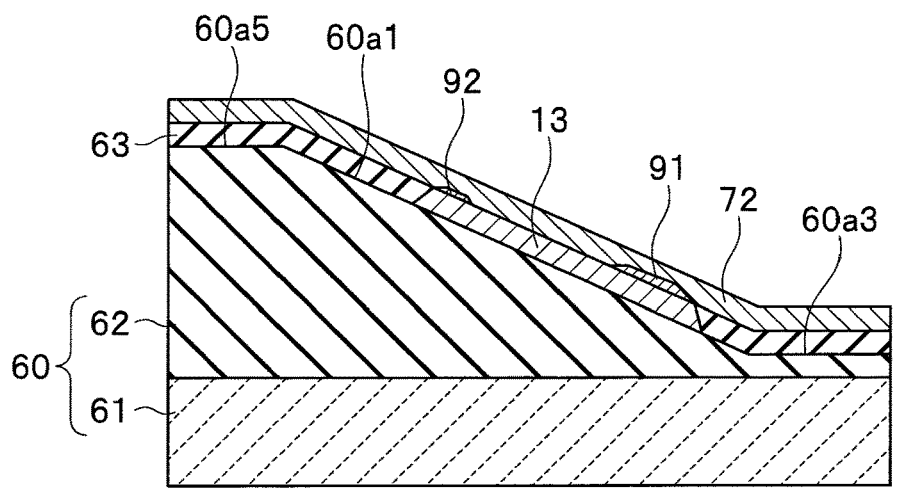
FIG. 8 is a cross-sectional view illustrating a step that follows the step in FIG. 7.

FIG. 8 shows the next step. In this step, films for eventually making the layers constituting the MR element main bodies 11, 12, 21, 22, 31, 32, 41, and 42 of the MR elements 10, 20, 30, and 40 are formed in order. A layered film 72 for eventually making the MR element main bodies 11, 12, 21, 22, 31, 32, 41, and 42 is thereby formed on the lower electrodes 13, 23, 33, and 43 and the insulating layer 63.

Figure 9:
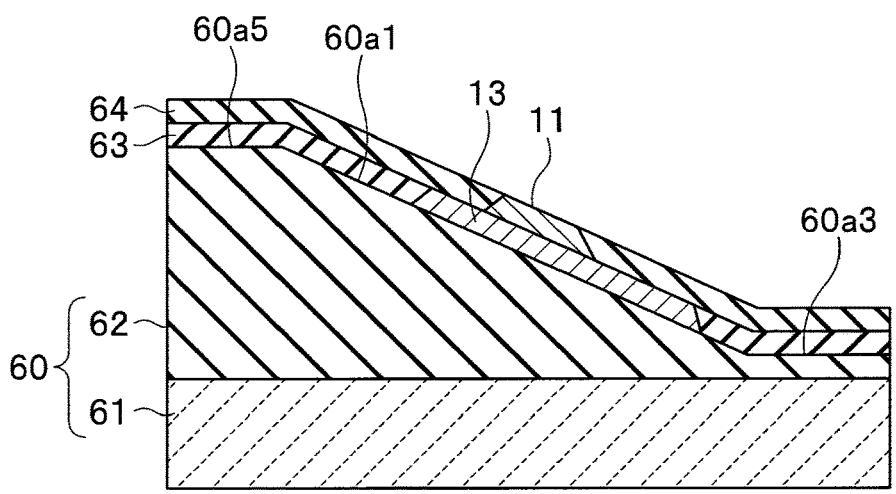
FIG. 9 is a cross-sectional view illustrating a step that follows the step in FIG. 8.

FIG. 9 shows the next step. In this step, non-shown eight etching masks for forming the MR element main bodies 11, 12, 21, 22, 31, 32, 41, and 42 are initially formed on the layered film 72. Like the first to fourth etching masks 81, the eight etching masks may have undercuts. Next, the layered film 72 is etched by ion milling, for example, using the eight etching masks. The layered film 72 is thereby made into the MR element main bodies 11, 12, 21, 22, 31, 32, 41, and 42. The etching also removes the first and second re-deposition films formed on the surfaces of the lower electrodes 13, 23, 33, and 43 in the etching step. Next, the insulating layer 64 is formed with the eight etching masks left unremoved. Next, the eight etching masks are removed.

Figure 10:
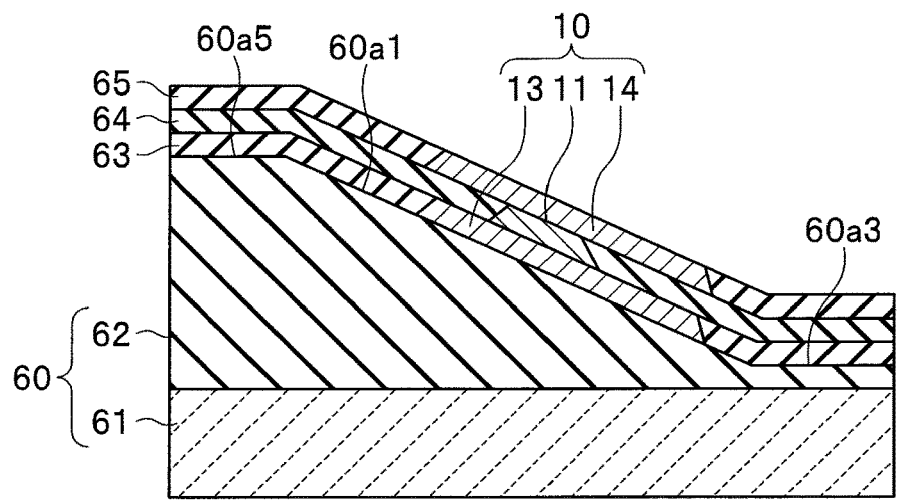
FIG. 10 is a cross-sectional view illustrating a step that follows the step in FIG. 9.

FIG. 10 shows the next step. In this step, a metal film for eventually making the upper electrodes 14, 15, 24, 25, 34, 35, 44, and 45 and the lead electrodes 51 and 52 is initially formed on the MR element main bodies 11, 12, 21, 22, 31, 32, 41, and 42 and the insulating layer 64. Next, non-shown six etching masks for forming the upper electrodes 14, 15, 24, 25, 34, 35, 44, and 45 are formed on the metal film. Next, the metal film is etched by ion milling, for example, using the six etching masks. The metal film is thereby made into the upper electrodes 14, 15, 24, 25, 34, 35, 44, and 45 and the lead electrodes 51 and 52. Next, the insulating layer 66 is formed with the six etching masks left unremoved. Next, the six etching masks are removed. After the removal of the etching masks, a non-shown insulating layer may be formed to cover the upper electrodes 14, 15, 24, 25, 34, 35, 44, and 45, the lead electrodes 51 and 52, and the insulating layer 65.

Next, a plurality of terminals constituting the power supply nodes V1 and V2 and the like are formed to complete the detection unit of the magnetic sensor 1.

Now, the undercut 81C of each of the first to fourth etching masks 81 will be described in detail. The undercut 81C of the first etching mask 81 will initially be described with reference to FIG. 7. The undercut 81C of the first etching mask 81 forms a first space SPa closest to the lower end Ea of the inclined portion 60a1 and a second space SPb closest to the upper end Eb of the inclined portion 60a1. The lower layer 81A is interposed between the first space SPa and the second space SPb. The first space SPa is a space located in front of the lower layer 81A in the Y direction. The second space SPb is a space located in front of the lower layer 81A in the −Y direction.

The lower layer 81A of the first etching mask 81 is formed by applying a material having fluidity to the entire top surface of the stack. The material increases in thickness on the lower end Ea side of the inclined portion 60a1, and decreases on the upper end Eb side of the inclined portion 60a1.

Here, a direction perpendicular to the bottom surface 60b of the support member 60 will be defined as a first direction D1. The first direction D1 is also parallel to the Z direction. A dimension in the first direction D1 will hereinafter be referred to as a height. The closer to the lower end Ea of the inclined portion 60a1, the greater the height of the lower layer 81A of the first etching mask 81 before the patterning of the upper layer 81B. As described above, the undercut 81C is formed by removing a part of the lower layer 81A in patterning the upper layer 81B. Each of the first and second spaces SPa and SPb thus increases in height toward the lower end Ea of the inclined portion 60a1. Moreover, the height of the first space SPa is greater than that of the second space SPb. Specifically, the maximum height of the first space SPa is greater than that of the second space SPb. The minimum height of the first space SPa may be greater than the maximum height of the second space SPb.

A direction parallel to a direction from the lower end Ea to the upper end Eb of the inclined portion 60a1 will be defined as a second direction D2u. As described above, the height of the first space SPa is greater than that of the second space SPb. In patterning the upper layer 81B, the developing agent is therefore more likely to enter the first space SPa than the second space SPb. As a result, the dimension of the first space SPa in the second direction D2u becomes greater than the dimension of the second space SPb in the second direction D2u.

The foregoing description of the undercut 81C of the first etching mask 81 also applies to the undercut 81C of the second etching mask 81.

The first and second etching masks 81 and the third and fourth etching masks 81 are plane-symmetrical about the XZ plane therebetween. A direction parallel to a direction from the lower end Ec to the upper end Ed of the inclined portion 60a2 (see FIG. 4) will be defined as a second direction D2v. The foregoing description of the undercut 81C of each of the first and second etching masks 81 also applies to the undercut 81C of each of the third and fourth etching masks 81 if the reference numeral and symbols 60a1, Ea, Eb, and D2u are replaced with the reference numeral and symbols 60a2, Ec, Ed, and D2v, respectively.

A direction parallel to the inclined portion 60a1 and orthogonal to the X direction will be defined as a U direction. A direction parallel to the inclined portion 60a2 and orthogonal to the X direction will be defined as a V direction. In the present embodiment, the U direction is a direction rotated by c from the Y direction in the −Z direction. The V direction is a direction rotated by c from the Y direction in the Z direction. α is an angle of greater than 0° and smaller than 90°. As shown in FIG. 7, the second directions D2u and D2v are also parallel to the U and V directions, respectively.

The function and effect of the magnetic sensor 1 according to the present embodiment will now be described. In the present embodiment, each of the first to fourth etching masks 81 has the undercut 81C. In the etching step, etched and scattered substances of the metal film 71 therefore enter the spaces formed by the undercut 81C to form the first and second re-deposition films on the surface of each of the lower electrodes 13, 23, 33, and 43.

Consider now the lower electrode 13. In the etching step, the first re-deposition film 91 is formed on the surface of the lower electrode 13, near the first end 13a of the lower electrode 13. The second re-deposition film 92 is formed on the surface of the lower electrode 13, near the second end 13b of the lower electrode 13. As shown in FIG. 7, the dimension of the first space SPa of the first etching mask 81 in the second direction D2u is greater than the dimension of the second space SPb in the second direction D2u. The re-deposition film is therefore formed over a wider range in the first space SPa than in the second space SPb. As a result, the dimension of the first re-deposition film 91 in the second direction D2u is greater than the dimension of the second re-deposition film 92 in the second direction D2u.

The dimension of each of the inclined portions 60a1 and 60a2 in a direction parallel to the Y direction (hereinafter, referred to as a width) can be reduced to increase the occupation area of the MR element main bodies per unit area. However, the smaller the width of the inclined portion 60a1, the smaller the width of the lower electrode 13. This reduces the distance from the first end 13a of the lower electrode 13 to the MR element main body 11. With the reduced distance, the MR element main body 11 can overlap the first re-deposition film 91. The same applies to the MR element main body 12. If the MR element main bodies 11 and 12 overlap the first re-deposition film 91, the MR element main bodies 11 and 12 are deformed. This causes a problem that the characteristics of the MR element main bodies 11 and 12, i.e., the characteristics of the MR element 10 become different from desired ones.

By contrast, in the present embodiment, each of the MR element main bodies 11 and 12 is located at a position closer to the second end 13b of the lower electrode 13 than to the first end 13a of the lower electrode 13. According to the present embodiment, the distance from the first end 13a to the MR element main body 11 and the distance from the first end 13a to the MR element main body 12 can thus be increased to prevent the occurrence of the foregoing problem.

In the present embodiment, the distance from the second end 13b to each of the MR element main bodies 11 and 12 is smaller than that from the first end 13a to each of the MR element main bodies 11 and 12. According to the present embodiment, the width of the inclined portion 60a1 can thus be reduced compared to the case where the distance from the second end 13b to each of the MR element main bodies 11 and 12 is greater than or equal to that from the first end 13a to each of the MR element main bodies 11 and 12, while the occurrence of the foregoing problem is prevented. Consequently, according to the present embodiment, the occupation area of the MR element main bodies per unit area can be increased.

Up to this point, a description has been given by taking the set including the MR element main bodies 11 and 12 and the lower electrode 13 as an example. The foregoing description also applies to the set including the MR element main bodies 21 and 22 and the lower electrode 23, the set including the MR element main bodies 31 and 32 and the lower electrode 33, and the set including the MR element main bodies 41 and 42 and the lower electrode 43. In other words, in the present embodiment, the MR element main bodies are located at positions closer to the second ends of the lower electrodes than to the first ends of the lower electrodes. According to the present embodiment, the distances from the first ends to the MR element main bodies can be increased to prevent the occurrence of the problem that the characteristics of the MR element main bodies, i.e., the characteristics of the MR elements become different from desired ones. Moreover, according to the present embodiment, the widths of the inclined portions 60a1 and 60a2 can be reduced compared to the case where the distances from the second ends to the MR element main bodies are greater than or equal to the distances from the first ends to the MR element main bodies, while the occurrence of the foregoing problem is prevented.

Modification Example

Next, a modification example of the magnetic sensor 1 according to the present embodiment will be described with reference to FIG. 11. Consider now the MR element 10. In the modification example, the distance from the upper end Eb of the inclined portion 60a1 to the first end 13a of the lower electrode 13 is greater than that from the upper end Eb to the lower end Ea of the inclined portion 60a1. In particular, in the modification example, the lower electrode 13 is located to extend from the inclined portion 60a1 to the flat portion 60a3. The first end 13a of the lower electrode 13 is located on the flat portion 60a3.

In the modification example, the distance from the first end 13a of the lower electrode 13 to each of the MR element main bodies 11 and 12 of the MR element 10 is greater than in the case where the first end 13a is located on the inclined portion 60a1. According to the modification example, the problem that the characteristics of the MR element main bodies 11 and 12, i.e., the characteristics of the MR element 10 become different from desired ones can thereby be prevented more effectively.

The foregoing description of the MR element 10 also applies to the MR element 20 if the reference numerals 10, 11, 12, 13, and 13a are replaced with the reference numerals 20, 21, 22, 23, and 23a, respectively.

The foregoing description of the MR elements 10 and 20 also applies to the MR elements 30 and 40 if the reference numerals and symbols 10, 11, 12, 13, 13a, 20, 21, 22, 23, 23a, 60a1, 60a3, Ea, and Eb are replaced with the reference numerals and symbols 30, 31, 32, 33, 33a, 40, 41, 42, 43, 43a, 60a2, 60a4, Ec, and Ed, respectively.

Figure 11:
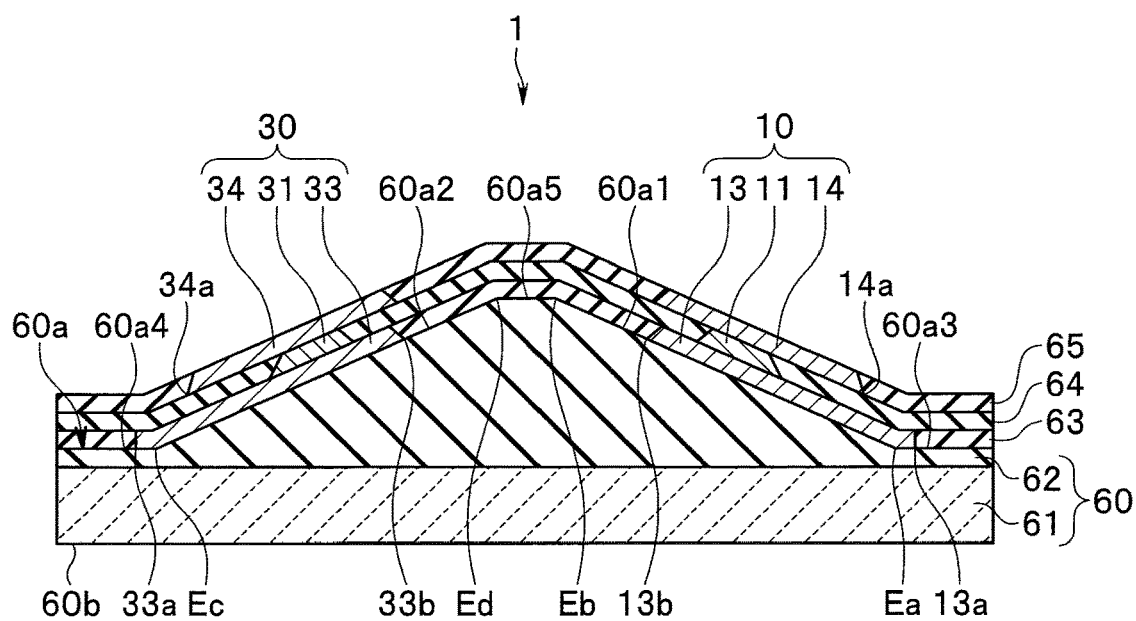
FIG. 11 is a cross-sectional view showing a cross section of a modification example of the magnetic sensor according to the embodiment of the invention.

As shown in FIG. 11, the upper electrode 14 has a third end 14a closest to the lower end Ea of the inclined portion 60a1. The distance from the MR element main body 11 to the third end 14a of the upper electrode 14 is smaller than that from the MR element main body 11 to the first end 13a of the lower electrode 13. The description of the upper electrode 14 also applies to the upper electrodes 15, 24, and 25.

As shown in FIG. 11, the upper electrode 34 has a third end 34a closest to the lower end Ec of the inclined portion 60a2. The distance from the MR element main body 31 to the third end 34a of the upper electrode 34 is smaller than that from the MR element main body 31 to the first end 33a of the lower electrode 33. The description of the upper electrode 34 also applies to the upper electrodes 35, 44, and 45.

The present invention is not limited to the foregoing embodiment, and various modifications may be made thereto. The number and arrangement of MR elements, the numbers of MR element main bodies, lower electrodes, and upper electrodes, and the shape of the support member are not limited to the examples described in the embodiment, and may be freely set as far as the requirements set forth in the claims are satisfied. For example, the number of MR elements may be one. Alternatively, the number of MR elements may be eight. In such a case, a magnetic sensor according to the present invention may include a first Wheatstone bridge circuit including four MR elements and a second Wheatstone bridge circuit including four MR elements.

Each MR element may include only one MR element main body. In such a case, each MR element may include only one lower electrode and only one upper electrode. Alternatively, each MR element may include three or more MR element main bodies. In such a case, each MR element may include two or more lower electrodes and two or more upper electrodes.

The top surface of the support member 60 may include only one inclined portion, or three or more inclined portions.

Obviously, many modifications and variations of the present invention are possible in the light of the above teachings. Thus, it is to be understood that, within the scope of the appended claims and equivalents thereof, the invention may be practiced in other embodiments than the foregoing most preferable embodiment.

What is claimed is:

1. A magnetic sensor comprising:
   a magnetoresistive element whose resistance changes with an external magnetic field; and
   a support member that supports the magnetoresistive element, wherein
   the support member includes a top surface opposed to the magnetoresistive element and a bottom surface located on a side opposite to the top surface,
   the top surface of the support member includes an inclined portion inclined relative to the bottom surface,
   the magnetoresistive element includes a main body, and a lower electrode and an upper electrode that supply a current to the main body,
   the main body is located on the inclined portion,
   the lower electrode is interposed between the main body and the inclined portion,
   the upper electrode is located on the main body,
   the inclined portion includes a lower end closest to the bottom surface and an upper end farthest from the bottom surface,
   the lower electrode includes a first end closest to the lower end of the inclined portion and a second end closest to the upper end of the inclined portion, and
   the main body is located at a position closer to the second end of the lower electrode than to the first end of the lower electrode.

2. The magnetic sensor according to claim 1, wherein a distance from the upper end of the inclined portion to the first end of the lower electrode is smaller than a distance from the upper end of the inclined portion to the lower end of the inclined portion.

3. The magnetic sensor according to claim 1, wherein a distance from the upper end of the inclined portion to the first end of the lower electrode is greater than a distance from the upper end of the inclined portion to the lower end of the inclined portion.

4. The magnetic sensor according to claim 1, wherein:
   the upper electrode includes a third end closest to the lower end of the inclined portion; and
   a distance from the main body to the third end of the upper electrode is smaller than that from the main body to the first end of the lower electrode.

5. A manufacturing method for a magnetic sensor for manufacturing the magnetic sensor according to claim 1, the manufacturing method comprising:
   a step of forming the magnetoresistive element; and
   a step of forming the support member, wherein
   the step of forming the magnetoresistive element includes
   a step of forming the main body,
   a step of forming the lower electrode, and
   a step of forming the upper electrode,
   the step of forming the lower electrode includes
   a step of forming a metal film on the support member,
   a step of forming an etching mask, and
   an etching step of etching the metal film by using the etching mask so that the metal film makes the lower electrode, and
   the etching mask has an undercut that forms a space between the etching mask and an underlayer of the etching mask.

6. The manufacturing method for a magnetic sensor according to claim 5, wherein:
   the undercut forms a first space closest to the lower end of the inclined portion and a second space closest to the upper end of the inclined portion;
   a maximum dimension of the first space in a first direction perpendicular to the bottom surface of the support member is greater than a maximum dimension of the second space in the first direction; and
   a dimension of the first space in a second direction parallel to a direction from the lower end to the upper end of the inclined portion is greater than a dimension of the second space in the second direction.

7. The manufacturing method for a magnetic sensor according to claim 5, wherein:
   the step of forming the etching mask includes forming the etching mask on the metal film; and
   the step of forming the main body is performed after the etching step.

* * * * *